United States Patent [19]
Lo et al.

[11] Patent Number: 5,661,732
[45] Date of Patent: Aug. 26, 1997

[54] PROGRAMMABLE ABIST MICROPROCESSOR FOR TESTING ARRAYS WITH TWO LOGICAL VIEWS

[75] Inventors: Tin-Chee Lo, Fishkill; William Vincent Huott, Holmes, both of N.Y.

[73] Assignee: International Business Machines Corporation, Armonk, N.Y.

[21] Appl. No.: 572,841

[22] Filed: Dec. 14, 1995

Related U.S. Application Data

[63] Continuation-in-part of Ser. No. 450,585, May 31, 1995.

[51] Int. Cl.$^6$ .................................. G11C 29/00
[52] U.S. Cl. ................ 371/22.2; 371/22.5; 365/200
[58] Field of Search .................. 371/22.2, 25.1, 371/27, 21.3, 22.5, 21.1; 365/201, 200

[56] References Cited

U.S. PATENT DOCUMENTS

| | | | |
|---|---|---|---|
| 4,740,970 | 4/1988 | Burrows et al. | 371/15 |
| 4,841,485 | 6/1989 | Prilik et al. | 365/201 |
| 5,138,619 | 8/1992 | Fasang et al. | 371/21.1 |
| 5,173,906 | 12/1992 | Dreibelbis et al. | 371/22.2 |
| 5,258,986 | 11/1993 | Zerbe | 371/21.2 |
| 5,313,424 | 5/1994 | Adams et al. | 365/200 |
| 5,386,392 | 1/1995 | Cantiant et al. | 365/233 |
| 5,388,104 | 2/1995 | Shirotori et al. | 371/21.1 |
| 5,442,641 | 8/1995 | Beranger et al. | 371/21.2 |
| 5,471,482 | 11/1995 | Byers et al. | 371/21.2 |

OTHER PUBLICATIONS

IBM Journal of Research and Development, "Boundary-Scann Design Principles for Efficient LSSD ASIC Testing", by R. W. Bassett et al. vol. 34, No. 2/3, Mar./May, 1990.

U.S. application No. 08/450,585 filed May 31, 1995, by Turgeon et al, entitled "Programmable Built-in Self Test Method and Controller for Arrays", IBM Docket #P0995004.

U.S. application No. 08/572,843 filed Dec. 14, 1995 by Huott et al, entitled "programmable Computer System Element With Built-In Self Test Method and Apparatus for Repair During Power On", IBM Docket #P0995008.

Primary Examiner—Robert W. Beausoliel, Jr.
Assistant Examiner—Nadeem Iqbal
Attorney, Agent, or Firm—Lynn L. Augspurger

[57] ABSTRACT

Computer system element has a VLSI array with redundant areas and an ABIST (Array Built-In Self Test system). The ABIST controller allows self test functions (e.g. test patterns, read/write access, and test sequences) to be used with dual logical views to reduce test time. The ABIST generates pseudo-random address patterns for improved test coverage. A jump-to-third pointer control command enables branching to perform looping after a background has been filled. A data register is divided into multiple sections to enable a Walking/Marching pattern to be executed individually and concurrently in the dual views to further reduce test times.

16 Claims, 7 Drawing Sheets

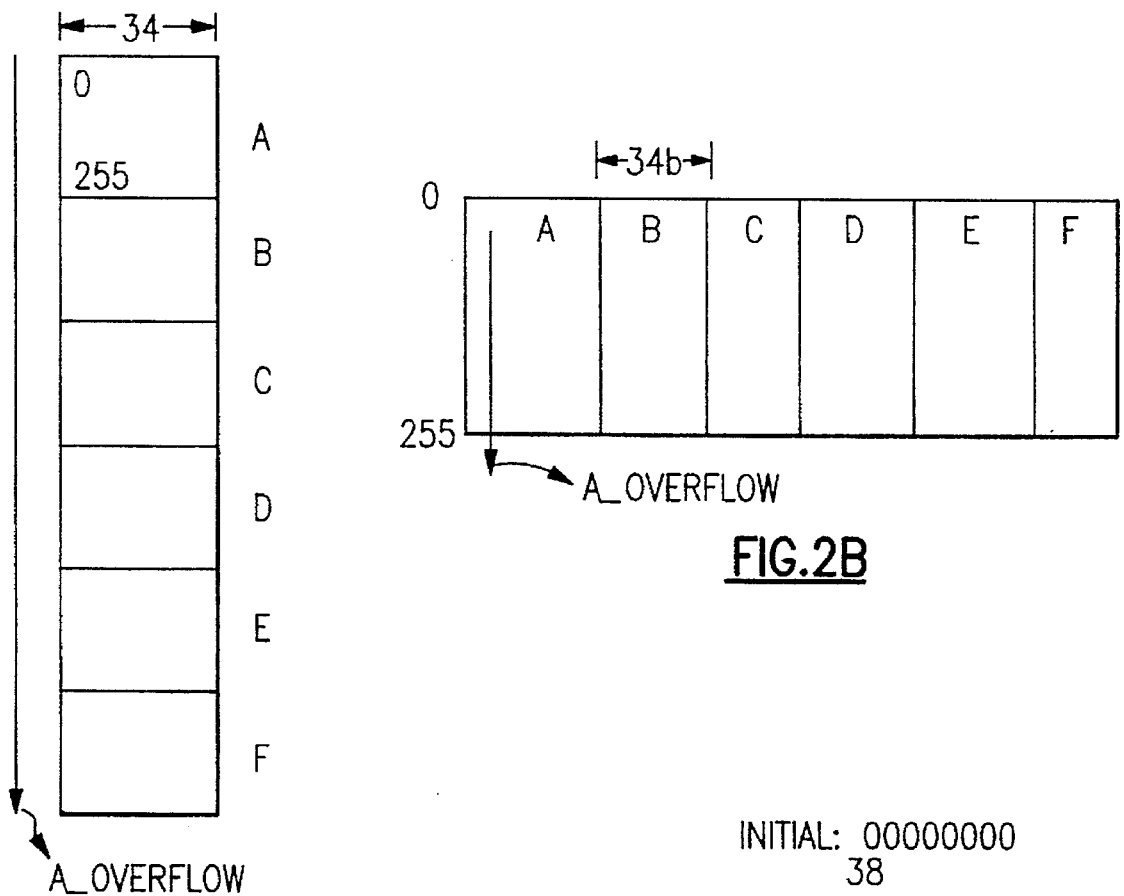

| TABLE 5. MICRO-CODE ARRAY ADDRESS POINTER FIELD | |
|---|---|
| VALUES | MEANINGS |
| 000 | DECREMENT ROM POINTER UNTIL ADDRESS SPACE HAS BEEN FULLY EXPLORED AT WHICH TIME ROM POINTER IS INCREMENTED BY 2. |
| 001 | INCREMENT ROM POINTER UNCONDITIONALLY. |
| 010 | HOLD ROM POINTER UNTIL ADDRESS SPACE HAS BEEN FULLY EXPLORED AT WHICH TIME ROM POINTER IS INCREMENTED BY ONE. |
| 011 | RESET ROM POINTER TO (000) UNTIL ADDRESS SPACE HAS BEEN FULLY EXPLORED AT WHICH TIME INCREMENT ROM POINTER BY ONE. |
| 100 | HOLD ROM POINTER UNTIL DATA SPACE HAS BEEN FULLY EXPLORED AT WHICH TIME ROM POINTER IS INCREMENTED BY 1. |
| 101 | RESET ROM POINTER TO (000) UNTIL DATA SPACE HAS BEEN FULLY EXPLORED AT WHICH TIME INCREMENT ROM POINTER BY ONE. |
| 110 | RESET ROM POINTER TO (010) UNTIL DATA AND ADDRESS SPACES HAVE BEEN FULLY EXPLORED, AT WHICH TIME ROM POINTER IS INCREMENTED BY 1. |
| 111 | RESET ROM POINTER TO "000" AND GENERATE ABIST_TEST_DONE SIGNAL UNLESS IT IS SUPPRESSED BY THE BURN-IN MODE SIGNAL, MODE2_t. |

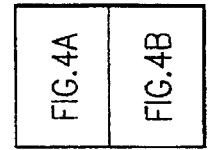

FIG.4B

| TABLE 7. DATA PATTERN CONTROL FIELD | |
|---|---|
| VALUES | MEANINGS |
| 000 | SHIFT AND ROTATE (i.e. LSB BECOMES MSB) |
| 001 | LOAD DATA REGISTER WITH(10001000010000100001000010000) |
| 010 | RIGHT-SHIFT AND INJECT ONE AT MSB |
| 011 | RIGHT-SHIFT AND INJECT ZERO AT MSB |
| 100 | HOLD DATA REGISTER |
| 101 | INVERT DATA REGISTER |
| 110 | RESET DATA REGISTER TO ZERO |
| 111 | LOAD DATA REGISTER WITH ALTERNATE ONE/ZEROs (i.e., 010101...01) |

PROGRAMMABLE ABIST MICROPROCESSOR FOR TESTING ARRAYS WITH TWO LOGICAL VIEWS

CROSS REFERENCE TO RELATED APPLICATIONS

This application is a continuation-in-part of the following patent application, and the applicants claim priority therefrom: U.S. Ser. No. 08/450,585, Filed May 31, 1995, by Turgeon et al, entitled "Programmable Built-In Self Test Method and Controller for Arrays; and This application is also related to the following application filed concurrently herewith: U.S. Ser. No. 08/572,843, Filed Dec. 14, 1995, by Huott et al, entitled "Programmable Computer System Element with Built-In Self Test Method and Apparatus for Repair During Power-On".

These applications and the present application are owned by one and the same assignee, International Business Machines Corporation of Armonk, New York.

The description set forth in these co-pending applications is hereby incorporated into the present application by this reference.

FIELD OF THE INVENTION

This invention relates to an improved built-in system for testing integrated circuits, and more particularly to a method and apparatus using a built in array test system that is programmable in computer systems to enable testing of chip arrays whose address space has two different logical views.

BACKGROUND OF THE INVENTION

As background for our invention computer systems use arrays to store information and these arrays are sometimes subject to hardware errors: individual array cell, bitline, wordline, etc.. In the related applications there is described ABIST (Array Built-In Self Test) microprocessors used to test and characterize on-chip arrays. This application addresses a system and method for testing and characterizing on-chip arrays in engineering, manufacturing, or burn-in environments with programmable test patterns. In general, during manufacturing of a computer system integrated circuit arrays are tested by providing a known data input at a known address to the array and comparing the output to the expected output. One well- known and widely used prior art system for testing integrated circuit logic, particularly integrated circuit memory arrays, is to form a dedicated test circuit on the chip with the array itself. This is called Array Built-In Self Test (ABIST).

An early example of ABIST technology, one that allowed elimination of an alternative microprocessor self test via a PLA LSSD test with I/O isolation of RAM functional test with no performance measurement, is represented by U.S. Pat. No. 4,841,485, granted Jun. 20, 1989 to R. J. Prilik et al, and assigned to International Business Machines Corp. This basic patent provided a memory array of bistable memory cells connectable to two different voltages that will operate when biased with both voltages at the same level in a bistable mode, and when biased at different voltage levels, will operate in an embedded self test binary pattern mode. The uses of this base technology also has been explored by others. Some related ABIST developments have been referenced above in the related pending applications of the assignee. There have been IBM Publications also relating to the area, including the IBM Journal of Research and Development article R. W. Bassett et al, "Boundary-Scann Design Principles for Efficient LSSD ASIC Testing, Vol. 34, No.2/3 March/May, 1990. Other IBM patents in the field include U.S. Pat. Nos. 5,442,641; 5,173,906 and 5,386,392.

With the many inventions in this field which have been made, this technology now allows high speed testing of the array without having to force correspondence between the array and the input/output connections to the chip itself.

U.S. Pat. No. 5,173,906 to Dreibelbis et al, issued Dec. 22, 1992, provides a BIST (Built-In Self Test) function for VLSI logic or memory module which is programmable. This circuitry is provided with a looping capability to enable enhanced burn-in testing. An on-chip test arrangement for VLSI circuits is provided with programmable data pattern sequences wherein the data patterns are selectable via instruction code in order to reduce the probability of self test redesign. However, this Dreibelbis patent does not provide flexibility to test VLSI circuits with any and all tests which can be required to test both static and dynamic arrays, in accordance with the invention claimed in the prior related application, U.S. Ser. No. 08/450,585 Filed May 31, 1995, by Turgeon et al, entitled "Programmable Built-In Self Test Method and Controller for Arrays". Generally, this prior application is our preferred ABIST embodiment for the present application representing an ABIST that has the programmable ability to test and identify defective array locations and using our invention to take corrective action.

The prior application disclosing our preferred ABIST embodiment in this application is being illustrated in a preferred manner for enabling the testing of arrays having two different logical views, one for READ mode, and one basically for WRITE mode.

SUMMARY OF THE INVENTION

Our invention provides for use of the ability of the ABIST to test and identify defective array locations for arrays having two different logical views, one for READ mode, and one basically for WRITE mode.

Our solution for testing of arrays with two different logical views, besides handling two different logical views, reduces elapsed test time and improves test coverage.

In accordance with our invention, an ABIST can handle an Array-Under-Test with two different logical views. In the preferred embodiment, for Read mode, all (in the preferred example the number is six) compartments are read concurrently, but for Write mode, only one compartment is to be written at a time. Also, special Read mode can be set up to make array's logical view looks like that for Write mode for some Read/Write macro operations. The ability that ABIST to handle a dual view array greatly reduces test time.

Our ABIST is capable of generating pseudo-random address patterns. It is done by providing a next address calculation logic facility for swapping the highest order two bits with the lowest order two bits at the output of the address incrementer.

Our ABIST branching makes micro-programming more efficient. We provide a hard coded "Jump-back-to-third" pointer control command. The first two entries of the test program stored in the Micro-Code Array are usually reserved for background filling of the Array-Under-Test. In accordance with our invention, we provide that these two entries are followed by our "Jump-back-to-third" capability to thus perform a looping algorithm after background has been properly filled. Our "jump-back-to-third" command is implemented in the architecture of the next pointer calculation logic and is activated by a pointer control code value (e.g.110).

Our ABIST can perform WALKING/MARCHING type pattern with shortened test time. Either WALKING or MARCHING patterns can be implemented using our ABIST data register which is divided into multiple sections. Each section performs WALKING/MARCHING individually and concurrently, resulting in reduction of test time.

These and other improvements are set forth in the following detailed description. For a better understanding of the invention with advantages and features, refer to the description and to the drawings.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A and 2B illustrates the address space definition of our invention, while FIG. 3 shows a data flow process which allows pseudo random address checking of cells of the array under test, improving results of testing.

FIG. 4A and FIG. 4B illustrates in more detail the ABIST Microprocessor of FIG. 1 and the specification of the microcode array address pointer field.

DETAILED DESCRIPTION OF THE INVENTION

Before considering our preferred embodiments in detail, it should be understood that in accordance with the invention we provide for use of our programmable ABIST, which has test functions including, but are not limited to, the following examples. Test data patterns may be held constant for the duration of a particular test sequence; circulated in a loop (marching a 0 through all bit positions against an all 1's background, for example), circulated in a loop using an external carry bit (this allows for further modification of the test pattern), inverted as it circulates in a loop, and complemented within the data in register. In accordance with our invention, we provide an improved method for testing and characterize on-chip arrays in engineering, manufacturing, burn-in environments with programmable test patterns, by implementing the testing of arrays with two different logical views: one for READ mode, and one for WRITE mode and special read mode. The arrays of our invention are adaptable to state-of-the-art very/ultra large scale integration (VLSI or ULSI) chips which include the VLSI memory array elements 9 which need to be self-tested. Our ABIST (Array Built-In Self-Test) is a small programmable micro-processor used to test and characterize on-chip arrays. We will describe how our ABIST can handle the testing of the Array-Under Test whose address space has two different logical views, one for read-mode and one for write-mode and special read mode.

Logical View of the Array-Under-Test

The Array-Under-Test is of a memory array which may be employed as a directory used in the shared L2 chip in an SMP (Symmetrical Multi-Processor) system. It consists of 6 compartments. Each compartment is 34 bits wide and 256 entries deep, as shown by FIG. 2b. The logical views of the array are mode dependent. For READ mode, the array is (34×6) bits wide and 256 entries deep which means all compartments are read concurrently. The 256 entries requires 8 address bits to access. These 8 bits define an address of a Congruence Class. For WRITE mode, each compartment is written separately and hence its logical view is 34 bits wide and (256*6) entries deep, as illustrated by the view of FIG. 2a. In actual application, each compartment is further divided into two data fields and each data field can be written separately. The ABIST design described here treats two data fields as one, i.e., when a compartment is written, both fields are written simultaneously; in other words, the two Write signals associated with a compartment are electrically tied together to form a single Write signal during ABIST testing. Data read out from the array also feed a bank of internal (within the array Macro) MISR registers (not shown) with feedback circuitry for signature generation. MISR registers are chained up in serially for scan-out reading.

ABIST Micro-Processor Overview

Figure 1:
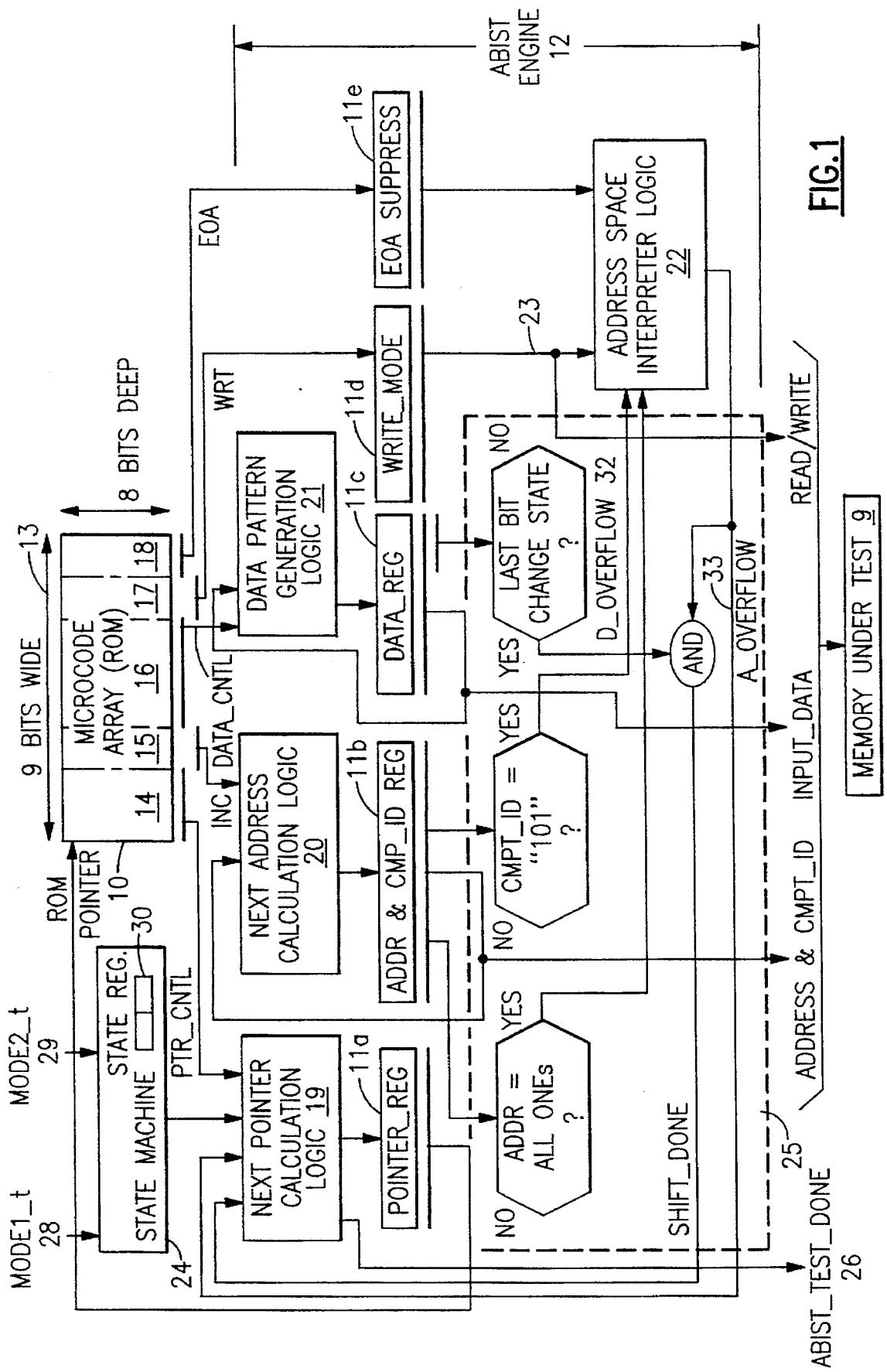
FIG. 1 is a general block diagram showing an improved data flow for our preferred an integrated circuit chip with a memory array and an array built-in self-test system both formed in the chip, which can test and possibly identify defective array locations and possibly identify possible corrective actions for arrays having two different logical views, one for READ mode, and one for WRITE mode.

The ABIST micro-processor block diagram is shown in FIG. 1. It consists of a Micro-code Array 10, the Registers 11a–11e, and the rest of the logic known as ABIST engine 12. The ABIST engine 12 receives a 9 bit word 13 from a Microcode Array 10 which stores a set of test program codes scanned-in prior to ABIST test. These 9 bits are divided into 5 fields: three bit Pointer field 14, one bit Address Increment field 15, three bit Data Control field 16, one bit Write Control field 17, and one bit End-Of-Address-Space control field 18.

ABIST engine 12 consists of many functional blocks. The "Next Pointer Calculation Logic" 19 determines the next address for accessing the Micro-Code Array 10. Address pattern is generated by "Next Address Calculation Logic" 20. Data pattern is generated by "Data Pattern Generation Logic" 21. Address space view is determined by new "Address Space Interpreter Logic" 22. The signal 23 Read/ Write control is derived from a Micro-Code Array field 17. Another piece of logic is a "State Machine" 24 which determined how many passes the micro-program has to be repeated for different variations of operational parameters. The registers 11a–11e and other control logic (included within block 25) process signals for these functional blocks.

Global Array Test Procedure

In the following description of our test procedure/process, we will describe control flow and their paths. The global test procedure from overall system point of view is first described for completeness:

1. Internal registers of the logic including the ABIST logic and its Micro-Code Array (which stores test program) are scanned in with proper values via the following path:

---

(Service Processor)-->(clock chip's "shift-1-bit" interface)-->
-->(STCM: On Product Self Test Control Macro)-->
-->(OPCG: On Product Clock Generation)-->
-->(Internal_Registers and ABIST's Micro-Code Arrays).

Scan_in is always done by some whole number of scan_A and scan_B clock pairs as:

A/B≧A/B ≧A/B −//≧A/B.

2. Clock chip then issues a start ABIST signal to the STCM who in turn will signal OPCG logic to turn on all system clocks for logic and arrays: C1 clock is the sample clock for registers and array; C2 clock is the launch clock for registers; and E clock is the enable clock for arrays.

```
Registers receive:
    C1/C2-->C1/C2-->C1/C2--//-->C1/C2.
Arrays receive:
    c1/E-->C1/E-->C1/E---//-->C1/E.
```

The first clock pulse received by ABIST 12 will cause it to execute .the program previously scanned into ABIST microprocessor's Micro-Code Array 10.

3. The ABIST engine signals clock chip a "done" 26 signal after thousands (typically) of cycles of execution. The values of an MISR (Multiple Input Shift Register not shown) within the Array-Under-Test macro which constitute a "signature" are locked up.
4. The system clocks will be stopped (C2 and E clock being last). Clock chip will begin scanning out MISR signature with the following clock sequence:

A/B≧A/B≧A/B−//≧A/B.

5. Service Processor analyses the MISR signature to see if it matches the expected result generated by simulation tools.

Logical Structure of the Micro-Code Read-Only Memory

The Logical structure including the scan chain is shown. The Micro-Code Array 10 is organized in 8×9 fashion with two distinct bits known as mode1_t (28) and mode2_t (29) bits which are used by the state machine 24 and its register 30. During ABIST operation, Micro-Code Array is always in Read-Only mode. Hence, Micro-Code Array 10 is sometimes referred to as ROM or ROS, Read-Only Memory/ Storage. Its content is loaded by scanning as illustrated by the following functional diagram.

dout(4:6) Command to control the Data Register (Data_cntl) (16)
dout(7) Read/Write Control (Wrt),(17)
dout(8) End-of-Address-indication suppression (EOA) (18)

Principle of operation of the ABIST engine

ABIST engine 12 for control receives 3 mode bits (not shown in FIG. 1) from an on-chip LBIST (Logic Built-In Self Test) macro (not shown). These 3 bits are DC signals scanned into the LBIST prior to ABIST operation. Relevant code points are shown in Table 1 on page 13.

TABLE 1

| Mode Bits Definitions | | | |
|---|---|---|---|
| abist_m0 | abist_m1 | abist_m2 | Code Point Definitions |
| 0 | 0 | 0 | LBIST writes all compartments concurrently |
| 0 | 0 | 1 | ABIST executes micro-program |
| 0 | 1 | 0 | System mode: ABIST engine is idle |
| 1 | 1 | 1 | RLF mode: abist_test_done signal becomes rlfout signal (pin multiplexing to save pin count) |

Note: rlfout is a signal from a "Timer" circuit used for characterizing array access time. RLF mode is one of the three modes of operation of the "Timer" circuit which is not to be discussed here.

Assuming the Micro-Code Array 10 has been loaded by scanning with a desirable pattern. If (abist_m0,1,2)=001 and the clock begins to pulse, the second clock cycle will produce an internal reset pulse (first which sets the internal registers to known initial states (ZERO in most cases). The arrival of the third clock cycle will produce a kick_abist pulse which kicks the ABIST into execution mode.

Micro-code array 10 as we have noted already also has two scan-loaded DC bits: mode1_t (28) and mode2_t (29). These 2 DC bits have complement outputs mode1_c and mode2_c respectively in actual implementation. mode1_t bit 28 is not part of the ROM, but its value is scanned-in to the State Machine 24 in the same manner as the Micro-Code Array bits. This bit determines the initial value of the 2 bit State_Register 30 of State Machine 24 which in turn determines the number of passes the microprogram is to be re-cycled.

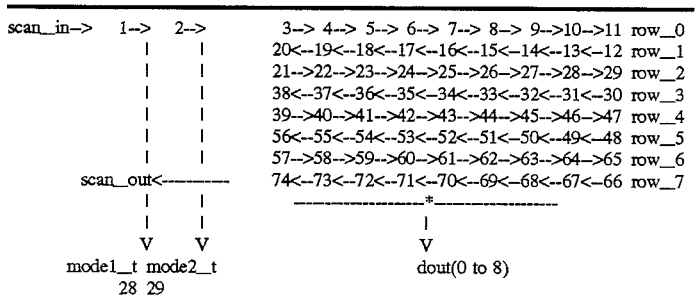

The output of the Micro-Code array 10 is divided into several fields with values of the respective memory cells.
dout(0:2) Micro-Code Array Address Pointer (Ptr_cntl) (14)
dout(3) Address Mode—Hold or Increment (Inc) Address (15)

TABLE 2

State Register Initialization

| Value | State Register Initialized To |
|---|---|
| 0 | Micro-program will be cycled 4 times, each time with different addressing modes. State_Register is loaded with "00" and stepped down in sequence to "01", "10", and finally rest at "11", totally 4 passes. |
| 1 | Micro-program will be used once. State_Register is loaded with "11", the final state. | mode2_t bit 29 is not part of the ROM, but its content is scanned-in to the State Machine 24 the same manner as the Micro-Code Array bits. This bit determines whether the ABIST is used for burn-in mode or test mode.

TABLE 3

Test or Burn-In Mode

| Value | Mode |
|---|---|
| 0 | Normal test mode. End-of-test is signified by abist_test_done signal. |
| 1 | Burn-in mode. Micro-program will be executed endlessly. Signal abist_test_done will be suppressed. |

As noted, there is a 2 bit State_Register 30 for the State Machine 24 which controls the address modes each time the micro-program is executed. The definitions of these two bits are shown in Table 4.

TABLE 4

ABIST Engine States

| State | Address Mode |
|---|---|
| 00 | Address descending from (11..11) to (00..00) in ramdom manner |
| 01 | Address descending from (11..11) to (00..00) in orderly manner |
| 10 | Address ascending from (00..00) to (11..11) in random manner |
| 11 | Address ascending from (00..00) to (11..11) in orderly manner |

Note:
• The term "Address" here refers to the 8 bit Congruence Class address. Compartment_ID is not part of it. Compartment_ID is always in ascending order (from 000 to 101).
• Address counter is always in ascending (increment) mode. Address descending is accomplished by sending a "flip" signal to the Array-under-test to flip its address buffers' true/complement signals.
• Random address is generated in this manner: Address counter starts out with all ZEROs; it is then incremented by '1'; the two highest order bits (0:1) are swapped with the lowest order bits (6:7) resulting in (6:7, 2:5, 0:1) which is loaded back into the Address register as (0:7).

After the arrival of the first clock, an ABIST reset pulse is generated. It is followed by a "kick_abist" pulse if the ABIST engine is prompted to execute by the 3 mode bits described earlier.

Testing Procedure in conjunction with ABIST engine 12 is now described:
1. Scan test program into the Micro-Code Array 10 and initialize all internal registers. In particular, a register called "cycle1_q" must be initialized to logic ONE who will cause the generation of the kick_abist pulse later. Also condition the 3 DC mode bits from LBIST logic to "001".
2. Activate the clocks to cause ABIST's reset and kick_abist pulses to be generated in proper sequence. It is followed by an execution pulse test_mode_s.
3. Testing is underway for thousands of cycles awaiting a completion signal called "abist_test_done" 26 to go high at which time ABIST engine 12 stops and MISR registers are locked. This signal, once goes high will remain high until LBIST logic resets it prior to normal system operation.

4. MISR signature has been generated by the directory array and has been latched up awaiting Service Processor to scan it out for evaluation.

Next Pointer Calculation Logic 19: This logic receives pointer control information also known as ch_abist_prt (0:2) 14 from the Micro-Code Array 10. During testing, same operation may repeat and loop through the entire address or data spaces.

In such cases, ROM pointer 31 will remain constant until certain loop breaking event has occurred. Two signals are used to break the loop: d_overflow 32 or a_overflow 33 are used to detect the end of data or address spaces.

ch_abist_prt(0:2) definition from field 14: This Pointer control field determines the next ROM (Micro-Code Array) pointer as defined in Table 5.

Figure 4A:
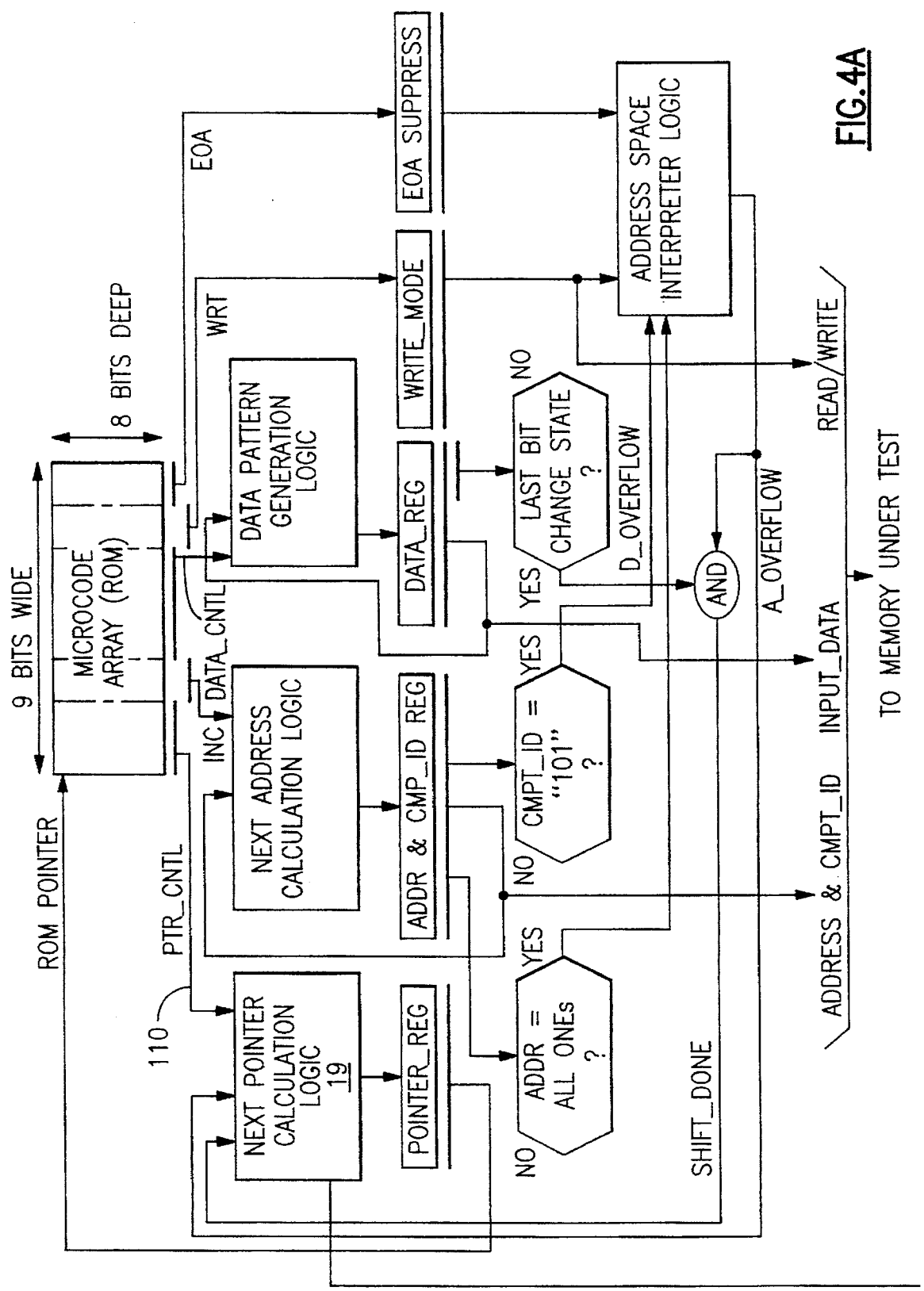

Referring first to FIG. 4, it will be see that we have added a code point of 110 an instruction for branching from the existing pointer position to "010" as a new microprogramming instruction added to the Next Pointer Calculation Logic 19 as shown in FIG. 4. With this added instruction, all practical test programs can be written without the need for the complicated "branch-to-any" instruction. This jump-to-third instruction allows the first two entries of the micro-code array to be reserved for background writing and background reading of the Memory-Under-Test. A micro-programming example is to be discussed later in FIG. 5.

Figure 6A:
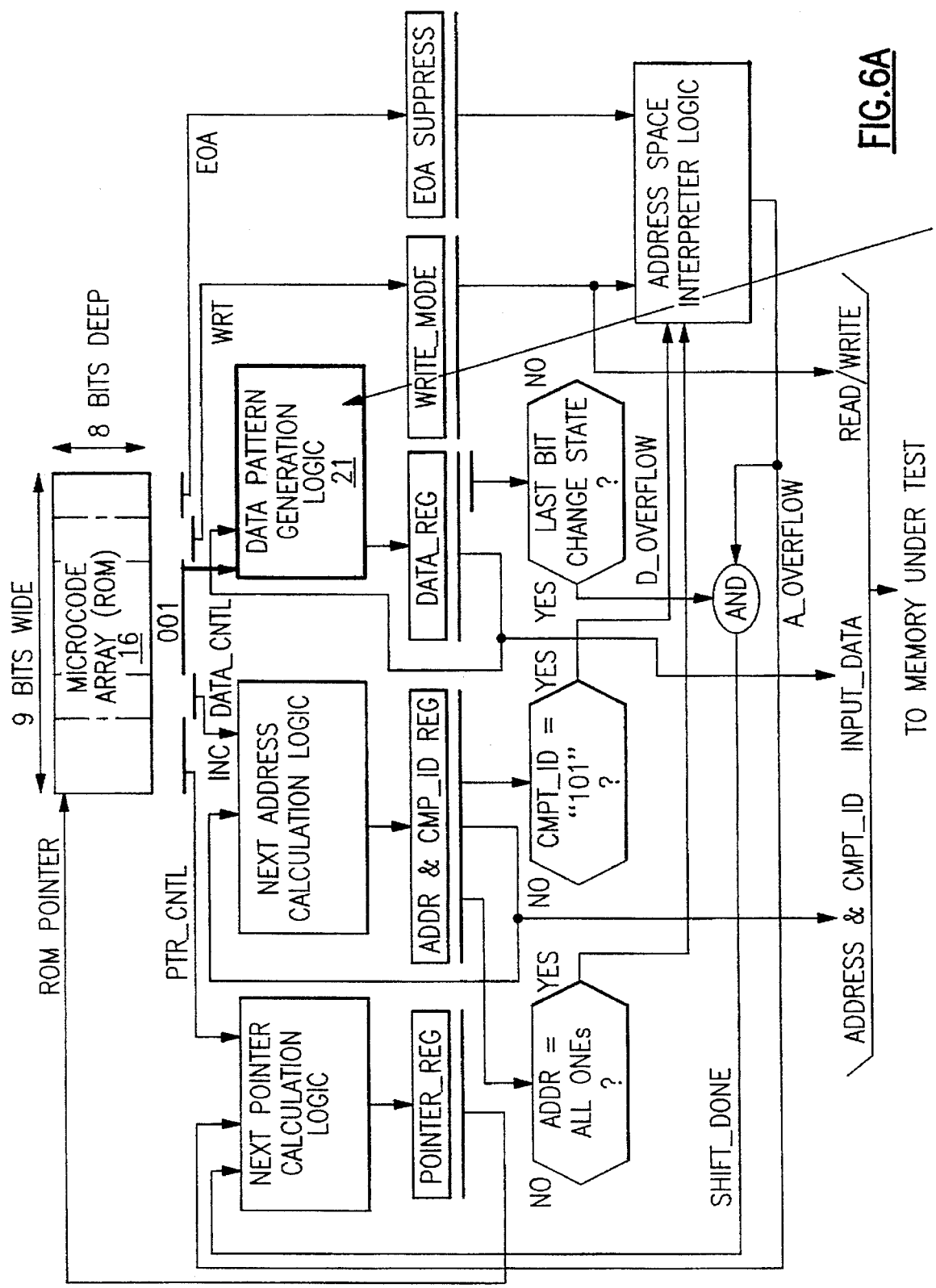
FIG. 6A and FIG. 6B illustrates in more detail the ABIST Microprocessor of FIG. 1 and the specification of the data patter control field.
Figure 6B:
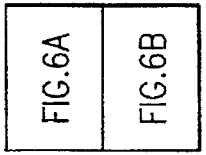

This code point 110 of FIG. 4 (Table 5) is architected into the next pointer control logic 19 shown in FIGS. 1, 4 and 6.

TABLE 5

Micro-Code Array Address Pointer field

| Values | Meanings |
|---|---|
| 000 | Decrement ROM pointer until address space has been fully explored at which time ROM pointer is incremented by 2. |
| 001 | Increment ROM pointer unconditionally. |
| 010 | Hold ROM pointer until address space has been fully explored at which time ROM pointer is incremented by one. |
| 011 | Reset ROM pointer to (000) until address space has been fully explored at which time increment ROM pointer by one. |
| 100 | Hold ROM pointer until data space has been fully explored at which time ROM pointer is incremented by 1. |
| 101 | Reset ROM pointer to (000) until data space has been fully explored at which time increment ROM pointer by one. |
| 110 | Reset ROM pointer to (010) until data and address spaces have been fully explored, at which time ROM pointer is incremented by 1. |
| 111 | Reset ROM pointer to "000" and generate abist_test_done signal unless it is suppressed by the burn-in mode signal, mode2_t. |

Note: Definition of "Address Space" and "Data Space":
• When Directory RAM is in Write-mode, address space means all congruence entries (256) plus six compartments. Each compartment is individually written.
• When Directory RAM is in Read-mode, address space means just all congruence entries because 6 compartments are read simultaneously.
• End of address space is signified by a signal a_overflow.
• End of data space means the last bit of the last address has changed state. This is evidenced in executing data shift patterns. End of data space is signified by a signal d_overflow.

Next Address Calculation Logic 20:: This logic calculates the next address including the compartment_ID used to access the Memory-under-test. It receives a one bit signal from the Micro-Code Array's field 15. This "Inc" signal, ch_abist_addr_inc, has a definition as shown in Table 6.

Before reviewing the following Table 6, one should review FIG. 3 where it is shown that when ABIST is operated in address increment mode, the address generated by the ABIST Engine 12 will increased from all ZEROs to all ONEs through one of the following two paths: (a) Simple linear increase which simply incrementing the current value by one in binary fashion; or (b) psedo-random migration from all ZEROs to all ONEs with random jumps in between: The two bits 28, 29 provided to the register 30 within the state machine 24 determines which path is to be taken.

A psedo-random address pattern is generated in a simple manner: The current value of the address register 11b is first incremented by one via an incrementer 35. The two highest order bits 37 are then swapped with the lowest order bits 36 to form a new address value to be used. This new value is now also fed back into the address register 11b to form the current value. FIG. 3 illustrates the arrangement.

TABLE 6

Address Increment Field

| Values | Meanings |
|---|---|
| 0 | Do not increment memory address. |
| 1 | Increment memory address. |

Data Pattern Generation Logic 21: This logic receives a 3 bit Data_cntl code, ch_abist_data_ctrl(0:2), from the Micro-Code Array's field 16 to generated various data patterns for the Array-Under-Test. This encoded bus determines the content of the Data Register 11c each and every cycle. The definition is shown in Table 7.

TABLE 7

Data Pattern Control Field

| Values | Meanings |
|---|---|
| 000 | Shift and Rotate (i.e. LSB becomes MSB) |
| 001 | Load Data Register with (1000100001000010000100001000010000) |
| 010 | Right-shift and Inject ONE at MSB |
| 011 | Right-shift and Inject ZERO at MSB |
| 100 | Hold Data Register |
| 101 | Invert Data Register |
| 110 | Reset Data Register to ZERO |
| 111 | Load Data Register with Alternate ONE/ZEROs (i.e., 010101...01) |

Note:
• For code = 001, data are divided into 7 sections with the MSB of each section being a ONE. This special data pattern is used to reduce test time when the tests involve data shifting. Shifting is done concurrently for all data sections. As a result, the number of shift is 4 positions. After shifting is completed, the LSB changes state, signifying the end of the data space.
• For code = 010 or 011, injections are done to all 7 data sections simultaneously in order to reduce test time.
• Other than special data patterns defined by code points 001, 110, and 111, arbitrary patterns can be scanned into the Data Register prior to ABIST operation resulting in infinite number of possible data patterns.
• Code = 000 is used for WALKING patterns. Code = 010 or 011 is used for PAINTING (also called MARCHING) patterns.
• Code = 111 can be used for CHECKER_BOARD or COLUMN_STRIPE kind of patterns. Code = 110 can be used for BLANKET ZERO pattern. Code = 110 and 101 can be used for BLANKET_ONE or WORDLINE_STRIPE patterns.

This psedo-random pattern generator has an interesting characteristic. It starts out with an initial set of values 38 with all ZEROs and has a final set of values 39 when it is finished up with all ONEs with reproduceble random jumps 40 in between, as sketched in the upper portion of FIG. 3. Because the end-of-address is detected by monitoring whether the new value is all ONEs or not, this psedo-random pattern generator can readily fit into the existing control logic. It is done by providing a next address calculation logic 20 facility for swapping the highest order two bits with the lowest order two bits at the output of the address incrementer. The interesting characteristic is that the initial and final values of the addresses are (00..00) and (11.11) respectively whereas random values appear in between. Since the boundary condition is the same as that for ABISTs without this capability, there is no need to re-design the ABIST control logic for End-Of-Address-Space detection. Adding this random addressing capability virtually adds no complexity to the engine design. Random address pattern resembles more real system environment and improves test coverage.

Figure 5:
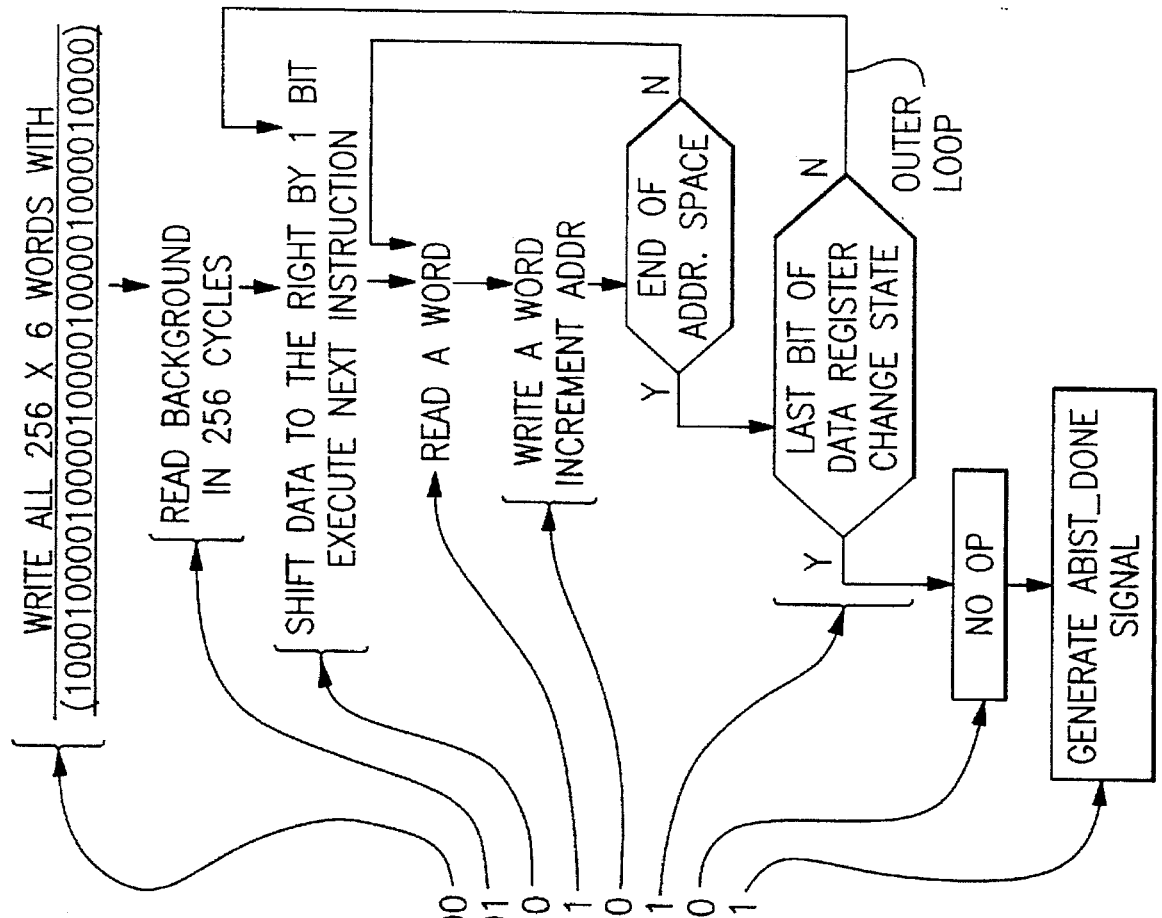
FIG. 5 illustrates how a walking test is performed along each bit position of an array under test and how the "jump-back-to-third" command is used.

FIG. 5 illustrates what we call WALKING/MARCHING by illustration of a WALKING pattern. (Those skilled in the art will appreciate that the figure also illustrates how MARCHING can be performed, e.g. by substitution of the value sequence of 10000, 11000, 11100. 11110, 11111, for 10000, 01000, 00100, 00010, 00001.) With the illustration, for WALKING the background is first initialized to ZEROs and then a ONE is Walked along each bit position of the cell rows. Thus FIG. 5 shows a test pattern which consists of first writing the memory background with several sections of ONE-plus-many-ZEROs, and the 'step' of reading the entire background. Afterwards, the single ONE of each section begins to walk to the right, one bit position at a time for all sections simultaneously, until the ONES reach the end of their respective sections. FIG. 5 shows two loops. The minor or inner loop makes sure all words have done their shift. The outer or major loop ensures that shifting has been done for all bit positions. Note that the major outer loop goes back to "010" of the micro-code array 10 address, reserving "000" and "001" for background writing and and background reading, while allowing the "Jump-back-to-third" branch. Thus our ABIST can perform WALKING/MARCHING pattern with shortened test time. Either WALKING or MARCHING patterns can be implemented using our ABIST data register which is divided into multiple sections. Each section performs WALKING/MARCHING individually and concurrently, resulting in reduction of test time.

As have described in FIG. 5, shifting time and hence test time is greatly reduced by dividing the data register 11c into many (7 in this example) or multiple sections. The ONE within each section will need to shift 4 positions instead of 33 in order to reach to the end. FIG. 6 shows that this new code point is architected into the Data Pattern Generation Logic 21 by the setting of the field 16 to a value of "001".

It will be noted that the ABIST provides for two different logical views. In the preferred embodiment, for Read mode, all (in the preferred example the number is six) compartments are read concurrently, but for Write mode, only one compartment is to be written at a time. Also, special Read mode can be set up to make array's logical view looked like that for Write mode for some macro operations. The ability that ABIST can handle dual view array greatly reduces test time. In accordance with our invention we have provided the new address space intrepreter logic 22, which determines an addresss space view. One of the logical views is the READ mode, and another is a WRITE mode. As shown in FIG. 1, 4 and 6, the EOA one bit field 18 is coupled to the EOA Supress register 11e whose value influences the logical view.

Read/Write Control Logic 23: This logic-receives a 1 bit wrt signal, ch_abist_wrt, from the Micro-Code Array's field 17. This write Control field has the definition as shown in Table 8.

TABLE 8

Read/Write Control Field

| Values | Meanings |
|---|---|
| 0 | Set Array-Under-Test in Read mode. |
| 1 | Set Array-Under-Test in Write mode. |

Address Space Interpreter Logic 22: This logic receives a 1 bit EOA signal, ch_abist_eas_ok, from the Micro-Code Array's field 18. End-Of-Address-Space (EOA) indication, a_overflow 33, is generated based on whether it is a Read or Write operation, and whether the labt address location has been explored or not. Signal ch_abist_eas_ok field 18 of micro-code array determines whether EOA condition should be masked or not.

TABLE 9

End-Of-Address-Space Control field

| Values | Meanings |
|---|---|
| 0 | EOA detection suppressed. |
| 1 | EOA detection enabled. |

Note: Typical application of this signal is when Read/Write operations are performed on each bit as a macro. During the time when the Read/Write is performed on the last bit of the address space, sometimes it is not desirable for the Read portion to raise the EOA indication because the macro operation is not completed yet until the Write portion has performed, only at that point will the EOA indication allowed to raise. Similar argument applies to Write/Read macro operation of a given applies to Write/Read macro operation of a given address.

Other Logic Functions: Two other processor output signals which are not shown but are provided by the ABIST engine 12 are worth noting: MISR (Multi-Input Shift Register) signature Generation enable signal and address sequence reversing signal.

chc_misr_enable signal definition:

TABLE 10

MISR signature generation enable signal

| Values | Meanings |
|---|---|
| 1 | MISR is enabled during ABIST test mode. |
| 0 | MISR is disabled in all other cases. |

Note: Even when this signal is ONE, MISR will not be enabled unless the entire address space of the Array-under-test has been initialized by write operation during the ABIST test.

abist_ary_addrflip: Signal sent to the Array-Under-Test to control its address buffers. Definition:

TABLE 11

Address Flip Control

| Values | Meanings |
|---|---|
| 0 | Address buffer receives the true form of address for address ascending mode. |
| 1 | Address buffer receives the complement form of address for address descending mode. |

Micro-Programming Examples

Content of the ROS cells for different test programs are described. In all of the following cases, mode2_t 29 is set to '0'.

1. WOROW1R1: Write background ZEROs, Read background ZEROs; Write background ONEs; Read background ONEs. (#cycles:3604; 14380)=time needed for one_pass and four_passes)

| | |
|---|---|
| data_in_cellrow_0 <= "010111011"; | -- 000 |
| data_in_cellrow_1 <= "010110001"; | -- 001 |
| data_in_cellrow_2 <= "001010111"; | -- 010 |
| data_in_cellrow_3 <= "010110011"; | -- 011 |
| data_in_cellrow_4 <= "010110001"; | -- 100 |
| data_in_cellrow_5 <= "001010001"; | -- 101 |
| data_in_cellrow_6 <= "001010001"; | -- 110 |
| data_in_cellrow_7 <= "111010001"; | -- 111 |

2. WROWRI: Write word-0 with ZEROs, Read word-0 of ZEROs, do the same for all subsequent words; Repeat for opposite data. (#cycles:6162; 24613)

| | |
|---|---|
| data_in_cellrow_0 <= "001011010"; | -- 000 |
| data_in_cellrow_1 <= "000110001"; | -- 001 |
| data_in_cellrow_2 <= "001010101"; | -- 010 |
| data_in_cellrow_3 <= "001010010"; | -- 011 |
| data_in_cellrow_4 <= "000110001"; | -- 100 |
| data_in_cellrow_5 <= "001010101"; | -- 101 |
| data_in_cellrow_6 <= "001010001"; | -- 110 |
| data_in_cellrow_7 <= "111010001"; | -- 111 |

3. Write Word-0 with (0101..0101); Write Word-1 with (1010..1010); Continue this operations in even/odd word-pairs; Read The Entire Array. (#cycles:1811; 72080)

| | |
|---|---|
| data_in_cellrow_0 <= "001111111"; | -- 000 |
| data_in_cellrow_1 <= "000110111"; | -- 001 |
| data_in_cellrow_2 <= "010110001"; | -- 010 |
| data_in_cellrow_3 <= "001010001"; | -- 011 |
| data_in_cellrow_4 <= "001010001"; | -- 100 |

```
data_in_cellrow_5 <= "001010001";        -- 101
data_in_cellrow_6 <= "001010001";        -- 110
data_in_cellrow_7 <= "111010001";        -- 111
```

4. WO_CHKB: Initialize the whole Array With ZEROs; Load dataReg with (0101..0101); Write inverted data as address advances to form CheckerBoard. Read CheckerBoard. Do the same with opposite data. (#cycles:5140)

```
data_in_cellrow_0 <= "010111011";        -- 000
data_in_cellrow_1 <= "001011101";        -- 001
data_in_cellrow_2 <= "010110111";        -- 010
data_in_cellrow_3 <= "010110001";        -- 011
data_in_cellrow_4 <= "001010001";        -- 100
data_in_cellrow_5 <= "010110111";        -- 101
data_in_cellrow_6 <= "010110001";        -- 110
data_in_cellrow_7 <= "111010001";        -- 111
```

5. BL_STRIP: Write background with bit line strips (i.e., each word with "0101..0101"; read background. Write background with opposite strips; read background. (#cycles: 3604)

```
data_in_cellrow_0 <= "010111111";        -- 000
data_in_cellrow_1 <= "010110001";        -- 001
data_in_cellrow_2 <= "001010101";        -- 010
data_in_cellrow_3 <= "010110011";        -- 011
data_in_cellrow_4 <= "010110001";        -- 100
data_in_cellrow_5 <= "001010001";        -- 101
data_in_cellrow_6 <= "001010001";        -- 110
data_in_cellrow_7 <= "111010001";        -- 111
```

6. WL_STRIP: Write Word-0 with (00..00); Write Word-1 with (11..11); Continue for all even/odd Word-pairs. Read background. Do the same with opposite data. (#cycles: 3602)

```
data_in_cellrow_0 <= "001111011";        -- 000
data_in_cellrow_1 <= "000110111";        -- 001
data_in_cellrow_2 <= "010110001";        -- 010
data_in_cellrow_3 <= "001110111";        -- 011
data_in_cellrow_4 <= "000110111";        -- 100
data_in_cellrow_5 <= "010110001";        -- 101
data_in_cellrow_6 <= "001010001";        -- 110
data_in_cellrow_7 <= "111010001";        -- 111
```

7. PAINT_WL1: Write background with ZEROs; Write first word with '1'; Read first word. Continue to paint each word with ONEs progressively until the entire background is ONEs. Read background ONE. (#cycles:4883)

```
data_in_cellrow_0 <= "010111011";        -- 000
data_in_cellrow_1 <= "001010101";        -- 001
data_in_cellrow_2 <= "001010000";        -- 010
data_in_cellrow_3 <= "000110011";        -- 011
data_in_cellrow_4 <= "010110001";        -- 100
data_in_cellrow_5 <= "001010001";        -- 101
data_in_cellrow_6 <= "001010001";        -- 110
data_in_cellrow_7 <= "111010001";        -- 111
```

8. PAINT_WL0: Write background with ONEs; Write first word with '0'; Read first word. Continue to paint each word with ZEROs progressively until the entire background is ZEROs. Read background ZERO. (#cycles: 4883)

```
data_in_cellrow_0 <= "001011000";        -- 000
data_in_cellrow_1 <= "001010100";        -- 001
data_in_cellrow_2 <= "010110011";        -- 010
data_in_cellrow_3 <= "001010101";        -- 011
data_in_cellrow_4 <= "001010000";        -- 100
data_in_cellrow_5 <= "000110011";        -- 101
data_in_cellrow_6 <= "010110001";        -- 110
data_in_cellrow_7 <= "111010001";        -- 111
```

9. W0_PR1PR0: Write background with ZEROs; Paint words with ONEs. Read background of ONEs. Paint words with ZEROs; Read background of ZEROs. (#cycles:8205)

```
data_in_cellrow_0 <= "010111011";        -- 000
data_in_cellrow_1 <= "001010110";        -- 001
data_in_cellrow_2 <= "000110101";        -- 010
data_in_cellrow_3 <= "010110001";        -- 011
data_in_cellrow_4 <= "001010110";        -- 100
data_in_cellrow_5 <= "000110101";        -- 101
data_in_cellrow_6 <= "010110001";        -- 110
data_in_cellrow_7 <= "111010001";        -- 111
```

10. WC_PRCPRT: Write background with CheckerBoard; Paint words with Complement data in Write/Read pair; Do this for all words; Read background of CheckerBoard-Bar. Paint words with true data in Write/Read pair; Do this for all words; Read background of True CheckerBoard. Data Register must first initialized to: "0101010101010101010101010101010101" (#cycles:8205)

```
data_in_cellrow_0 <= "010110111";        -- 000
data_in_cellrow_1 <= "001010110";        -- 001
data_in_cellrow_2 <= "000110001";        -- 010
data_in_cellrow_3 <= "010110001";        -- 011
data_in_cellrow_4 <= "001010110";        -- 100
data_in_cellrow_5 <= "000110001";        -- 101
data_in_cellrow_6 <= "010110001";        -- 110
data_in_cellrow_7 <= "111010001";        -- 111
```

11. WS_PRCPRT: Write background with Bit Line Stripes; Paint words with Complement data in Write/Read pair; Do this for all words; Read background of BitLineStripe-Bar. Paint words with true data in Write/Read pair; Do this for all words; Read background of True BitLineStripe. Data Register must first initialized to: "0101010101010101010101010101010101". (#cycles:8205)

```
data_in_cellrow_0 <= "010110011";        -- 000
data_in_cellrow_1 <= "001010110";        -- 001
data_in_cellrow_2 <= "000110101";        -- 010
data_in_cellrow_3 <= "010110001";        -- 011
data_in_cellrow_4 <= "001010110";        -- 100
data_in_cellrow_5 <= "000110101";        -- 101
data_in_cellrow_6 <= "010110001";        -- 110
data_in_cellrow_7 <= "111010001";        -- 111
```

12. BL_STP_2: Background is initialized to Bit Line Strip; Read background. Progressively convert each word to inverted Bit Line Strip by rotating the data register by one bit. Read background. (#cycles:5139)

```
data_in_cellrow_0 <= "010111111";    -- 000
data_in_cellrow_1 <= "010110001";    -- 001
data_in_cellrow_2 <= "001000011";    -- 010
data_in_cellrow_3 <= "001010010";    -- 011
data_in_cellrow_4 <= "000110001";    -- 100
data_in_cellrow_5 <= "110010001";    -- 101
data_in_cellrow_6 <= "010110001";    -- 110
data_in_cellrow_7 <= "111010001";    -- 111
```

13. WW_PRCPRT: Write background with WordLineStripe; Paint words with Complement data in Write/Read pair; Do this for all words; Read background of WordLineStripe-Bar. Paint words with true data in Write/Read pair; Do this for all words; Read background of True WordLineStripe. Data Register must first initialized to: "111111111111111111111111111111111" (#cycles:8205)

```
data_in_cellrow_0 <= "010110111";    -- 000
data_in_cellrow_1 <= "001010110";    -- 001
data_in_cellrow_2 <= "000110001";    -- 010
data_in_cellrow_3 <= "010110001";    -- 011
data_in_cellrow_4 <= "001010110";    -- 100
data_in_cellrow_5 <= "000110001";    -- 101
data_in_cellrow_6 <= "010110001";    -- 110
data_in_cellrow_7 <= "111010001";    -- 111
```

14. WALK_1: Background is initialized ZEROs; Walk a ONE along each bit position. (#cycles:14112)

```
data_in_cellrow_0 <= "010100111";    -- 000
data_in_cellrow_1 <= "010110001";    -- 001
data_in_cellrow_2 <= "001000011";    -- 010
data_in_cellrow_3 <= "001010010";    -- 011
data_in_cellrow_4 <= "000110001";    -- 100
data_in_cellrow_5 <= "110010001";    -- 101
data_in_cellrow_6 <= "001010001";    -- 110
data_in_cellrow_7 <= "111010001";    -- 111
```

15. WALK_0: In order to do "Walking of a ZERO" the data register must be reset to "011101111011110111101111011110111101111" & bit33_q must be reset to '1' (#Cycle:14103)

```
data_in_cellrow_0 <= "010110011";    -- 000
data_in_cellrow_1 <= "010110001";    -- 001
data_in_cellrow_2 <= "001000011";    -- 010
data_in_cellrow_3 <= "001010010";    -- 011
data_in_cellrow_4 <= "000110001";    -- 100
data_in_cellrow_5 <= "110010001";    -- 101
data_in_cellrow_6 <= "001010001";    -- 110
data_in_cellrow_7 <= "111010001";    -- 111
```

16. PAINT_BIT1: Painting of ONEs one bit at a time after background has first been filled with ZEROs. (#cycles:17183)

```
data_in_cellrow_0 <= "010110011";    -- 000
data_in_cellrow_1 <= "010110001";    -- 001
data_in_cellrow_2 <= "001001111";    -- 010
data_in_cellrow_3 <= "001010010";    -- 011
data_in_cellrow_4 <= "000110001";    -- 100
data_in_cellrow_5 <= "110010001";    -- 101
data_in_cellrow_6 <= "001010001";    -- 110
data_in_cellrow_7 <= "111010001";    -- 111
```

17. PAINT_BIT0: Painting of ZEROs one bit at a time after background has first been filled with ONEs. In order to do this test", the data register must be reset to "1111111111111111111111111111111111" and bit33_q must be reset to '1' (#cycles:17178)

```
data_in_cellrow_0 <= "010110011";    -- 000
data_in_cellrow_1 <= "010110001";    -- 001
data_in_cellrow_2 <= "001001111";    -- 010
data_in_cellrow_3 <= "001010010";    -- 011
data_in_cellrow_4 <= "000110001";    -- 100
data_in_cellrow_5 <= "110010001";    -- 101
data_in_cellrow_6 <= "001010001";    -- 110
data_in_cellrow_7 <= "111010001";    -- 111
```

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A computer system element comprising:

a VLSI array for storing information having redundant areas, and an array built-in, on-chip test system (ABIST) for both static and dynamic array testing of said VLSI array, said ABIST having a micro-code array, a micro-program stored in said micro-code array, state machine logic having a mode control register and dual mode inputs for said state machine for providing two distinct modes for said ABIST, logic for said ABIST coupled to said micro-code array including a next pointer calculation logic for determining the next address for accessing said micro-code array; next address calculation logic for generating an address pattern; data pattern generation logic for generating a data pattern;

said state machine logic being coupled to said next pointer calculation logic for determining how many passes said micro-program has been repeated at different stages of testing; and wherein said micro-program is a test program stored in said microcode array of said ABIST comprising a plurality of code words, each code word being divided into fields including a pointer field, an address increment field, a data control field, a write control field, and an end-of-address space control field, and said micro-program for said micro-code array during ABIST operation functions with said micro-code array in a read-only mode; and wherein two distinct mode bits used while testing said VLSI array with two logical views including a first READ mode bit and a second WRITE mode bit provided for mode control of said state machine.

2. A computer system element according to claim 1 wherein said ABIST further includes address space intrepreter logic for determining an address space view; and for providing two different logical views for testing said VLSI array, one of of said logical views is a READ mode, and the other logical view is a WRITE mode with the possibility that the READ mode view be the same as WRITE mode view for special cases in programming.

3. A computer system element according to claim 2 wherein during one of said logical views all cells of an array are read concurrently.

4. A computer system element according to claim 2 wherein during one of said logical views only one of a plurality of cell-rows making up an array is written at a time.

5. A computer system element according to claim 2 wherein during one of said logical views only one of a plurality of cell-rows making up an array is written at a time, while during a read mode all cells of an array are written concurrently.

6. A computer system element according to claim 2 wherein during testing said ABIST to test associated cells of a memory and identify defective array locations for arrays having two different logical views, one for READ mode, and one for WRITE mode or special READ mode.

7. A computer system element according to claim 6 wherein said VLSI Array-Under-Test has six compartments with two different logical views, and during testing of an Array-Under-Test with two different logical views, for Read mode, all six compartments are read concurrently, but for Write mode, only one compartment is to be written at a time.

8. A computer System element according to claim 7 wherein during testing of an Array-Under-Test with two different logical views, a Read mode can be set up to make array's logical view look like that for Write mode for some macro operations.

9. A computer system element according to claim 8 wherein during testing of an Array-Under-Test with two different logical views, said ABIST is capable of generating psedo-random address patterns.

10. A computer system element according to claim 9 wherein during test of a Memory-Under-Test with two different logical views said next address calculation logic facility causes swapping of highest order two bits with the lowest order two bits at the output of address incrementer logic provided by said next address calculation logic.

11. A computer system element according to claim 2 wherein micro-programming of said ABIST and architected commands provides a hard coded "Jump-back-to-third" pointer control command.

12. A computer system element according to claim 11 wherein a first two entries of a test program stored in the MicroCode Array are reserved for background filling of the Array-Under-Test, and said first two entries are followed by a "Jump-back-to-third" microcoded logic for performing a looping algorithm after background has been properly filled.

13. A computer system element according to claim 12 wherein said "jump-back-to-third" command is implemented in architecture logic provided by next pointer calculation logic and is activated by a pointer control code value.

14. A computer system element according to claim 2 wherein said ABIST is enabled by a microcode test pattern enabling either WALKING or MARCHING patterns to be used for testing cells using a data register which is divided into multiple sections.

15. A computer system element according to claim 14 wherein each of said multiple sections section performs WALKING/MARCHING individually and concurrently.

16. A computer system element according to claim 12 wherein during testing, said data register generates and applies deterministic data patterns to the data input ports of said VLSI array; and said address register generates addresses for application to said array chip in coordination with said data register.

* * * * *